United States Patent [19]

Okamoto et al.

[11] Patent Number: 5,033,063
[45] Date of Patent: Jul. 16, 1991

[54] SURFACE-ACOUSTIC-WAVE DEVICE

[75] Inventors: Takeshi Okamoto; Shoichi Minagawa, both of Tokyo, Japan

[73] Assignee: Clarion Co., Ltd., Tokyo, Japan

[21] Appl. No.: 336,211

[22] Filed: Apr. 11, 1989

[30] Foreign Application Priority Data

Apr. 20, 1988 [JP] Japan .................................. 63-99092

[51] Int. Cl.⁵ ............................................. H03D 9/04
[52] U.S. Cl. .................................... 375/90; 329/300; 333/196; 364/821; 375/96
[58] Field of Search ................... 375/1, 47, 80, 90, 96, 375/103; 329/300, 301, 328; 333/193, 195, 196; 364/728.01, 821

[56] References Cited

U.S. PATENT DOCUMENTS

| | | | |
|---|---|---|---|
| 4,543,547 | 9/1985 | Picquendar et al. | 329/300 |
| 4,592,009 | 5/1986 | Masheff | 364/821 |
| 4,897,659 | 1/1990 | Mellon | 375/116 |

OTHER PUBLICATIONS

S. Pasupathy, "Minimum Shift Keying: Spectrally Efficient Modulation", IEEE Communications Magazine, Jul. 1979, pp. 14–22.
J. H. Goll, D. C. Malocha, "An Application of SAW Convolvers to High Bandwidth Spread Spectrum Communications", IEEE Transactions on Microwave Theory and Techniques, vol. MTT-29, No. 5, May 1981, pp. 473–483.
Junichi Tominaga, Kimio Shibayama, "Surface-Acoustic-Wave MSK Matched Filter and its Application", Transactions on Electronic Communication Academy, '85/12, vol. J68-C, No. 12, pp. 1044–1052.
W. R. Smith, "SAW Filters for CPSM Spread Spectrum Communications", 1977, Ultrasonics Symposium Proceedings, pp. 524–528.
I. Yao, "High Performance Elastic Convolver with Parabolic Horns", 1980, Ultrasonics Symposium, pp. 37–42.
S. Minagawa et al., "Efficient ZnO-SiO₂-Si Sezawa Wave Convolver", IEEE Transactions on Sonics and Ultrasonics, vol. SU-32, No. 5, 1985, pp. 670–674.
B. T. Khuri-Yakub, G. S. Kino, "A Detailed Theory of the Monolithic Zinc Oxide on Silicon Convolver", IEEE Transactions on Sonics and Ultrasonics, vol. SU-24, No. 1, 1977, pp. 34–43.

Primary Examiner—Benedict V. Safourek
Attorney, Agent, or Firm—Flynn, Thiel, Boutell & Tanis

[57] ABSTRACT

A surface-acoustic-wave device includes at least two surface-acoustic-wave transducers made from metal and disposed along a surface acoustic wave propagating direction on a piezoelectric substrate. At least one of the transducers has a different bandwidth, and a convolver output gate electrode in the form a rectangular metal layer is provided between the transducer having the different bandwidth and another transducer.

10 Claims, 6 Drawing Sheets

PRIOR ART

FIG. 14

PRIOR ART

SURFACE-ACOUSTIC-WAVE DEVICE

FIELD OF THE INVENTION

This invention relates to a surface-acoustic-wave (abbreviated as "SAW" in this text) device for use in a spread-spectrum communication (abbreviated as "SSC" in this text).

BACKGROUND OF THE INVENTION

Recently, SSC is noted as a new communication system. In SSC, a SAW element is important as a component of an arrangement mainly utilizing a correlating function in the receiver, namely as a component of a SAW convolver.

Heretofore, bi-phase shift keying has often been used as a modulation system in SSC. However, MSK (minimum shift keying) is also noted as a digital signal modulation system.

In comparison with BPSK waves, MSK waves have a narrower band with respect to the same clock, have a better energy concentration to the main lobe, and have a better off-band characteristic. More specifically, under a limited band width for a system, a higher clock frequency is permitted in MSK than in BPSK, and a disturbance to adjacent channels can be diminished.

A problem with the MSK system is that generation of MSK-modulated waves was relatively complicated while BPSK-modulated waves were readily obtained.

Properties of MSK waves and MSK-wave generating processes from the viewpoint of circuitry are described in:

(Document 1)
"Minimum Shift Keying: Spectrally Efficient Modulation", S. Pasupathy, IEEE Communications Magazine, July 1979, pp.14-22.

(Document 2)
MSK generating processes using SAW elements are described in:
"An Application of SAW Convolvers to High Bandwidth Spread Spectrum Communications", J. H. Goll, D.C. Malocha, IEEE Transactions on Microwave Theory and Techniques, vol. MTT-29, No. 5, May 1981, pp.473-483.

(Document 3)
"Surface-Acoustic-Wave MSK Matched Filter and its Application", Junichi Tominaga, Shibayama, Transactions on Electronic Communication Academy, '85/12, Vol. J68-C, No. 12, pp.1044-1052.

(Document 4)
"SAW Filters for CPSM Spread Spectrum Communications", W. R. Smith, 1977 Ultrasonics Symposium Proceedings, pp.524-528.

According to Document 1, MSK waves may be expressed $$S(t) = a_I(t)\cos\left(\frac{\pi t}{2T}\right)\cos 2\pi f_c t + a_Q(t)\sin\left(\frac{\pi t}{2T}\right)\sin 2\pi f_c t \quad (1)$$

where
$a_I(t)$: even number bit of a code
$a_Q(t)$: odd number bit of the code
$T$: clock period
$f_c$: center frequency Document 1 teaches a method of establishing Equation (1) by a circuit arrangement, and this requires a much complicated structure.

Document 2 and Document 3 teach methods which require an impulse generator. In this respect, Document 4 teaches a method having a very simple structure.

The theory of the MSK-wave generating filter (called "MSK filter") of Document 4 is explained below, referring to FIG. 13.

Figure 13:
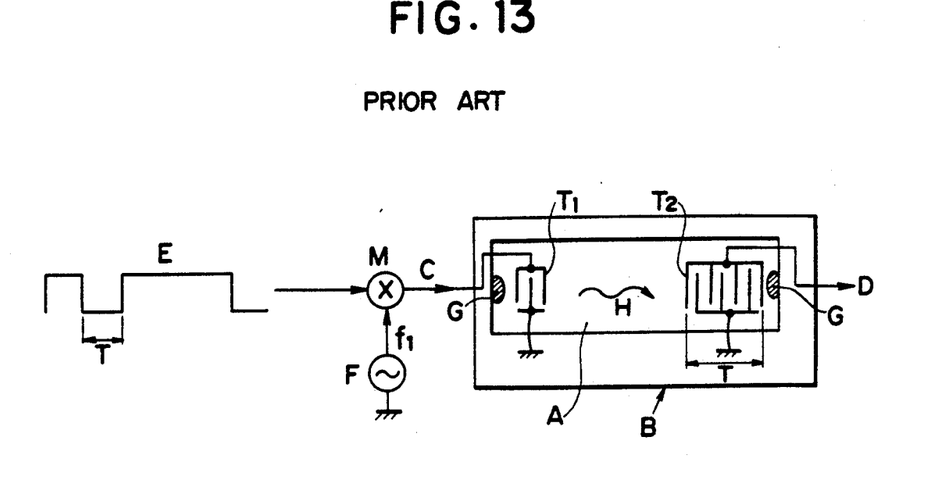
FIG. 13 is a schematic view of a prior art SAW device.

In FIG. 13, E refers to a baseband code, T refers to a clock period, M refers to a mixer, F refers to a signal source of center frequency $f_1$, B refers to an MSK filter, A refers to a piezoelectric substrate, C refers to an MSK filter input (BPSK), $T_1$ refers to an input transducer, $T_2$ refers to an output transducer, D refers to an MSK filter output, and G refers to a SAW absorber.

The MSK filter input C is obtained by mixing the baseband signal E of clock period T with an output of the sine wave signal source F of center frequency $f_1$. As a result, the input signal C behaves as a BPSK wave. The MSK filter consists of the input transducer $T_1$ and the output transducer $T_2$ obtained by providing aluminum or other metal on the piezoelectric substrate made from crystal, lithium niobate or other material. The SAW absorber G is provided at each end of the piezoelectric substrate for each input or output transducer $T_1$ or $T_2$ to absorb undesired SAW's.

The input transducer $T_1$ has a sufficiently small number of electrode fingers so as to establish a wideband characteristic.

The output transducer $T_2$ has the electrode length of time width T and the center frequency $f_2$, and satisfies the following relationship (see Document 4):

$$f_c = \frac{2m+1}{4T} \quad (2)$$

$$f_2 = f_c + \frac{1}{4T} \quad (3)$$

$$f_1 = f_c - \frac{1}{4T} \quad (4)$$

where $f_c$ and T are the same values as Equation (1).

When an input BPSK electric signal C is entered in the MSK filter, it is converted into a SAW by the input transducer $T_1$ and travels to the right (H). Thereby, an output electric signal D is obtained from the output transducer $T_2$.

When equations (2), (3) and (4) are satisfied, it is noted that the output wave D exhibits the MSK wave shown by Equation (1). Here, it is important that the input transducer $T_1$ has a wideband characteristic as described above and that the output transducer $T_2$ has the time width T and the center frequency $f_2$. Because of these characteristics, the output is the convolution between the input BPSK wave C and the output transducer $T_2$ and satisfies Equation (1).

As described, the MSK filter is advantageous in its simple structure.

Figure 14:
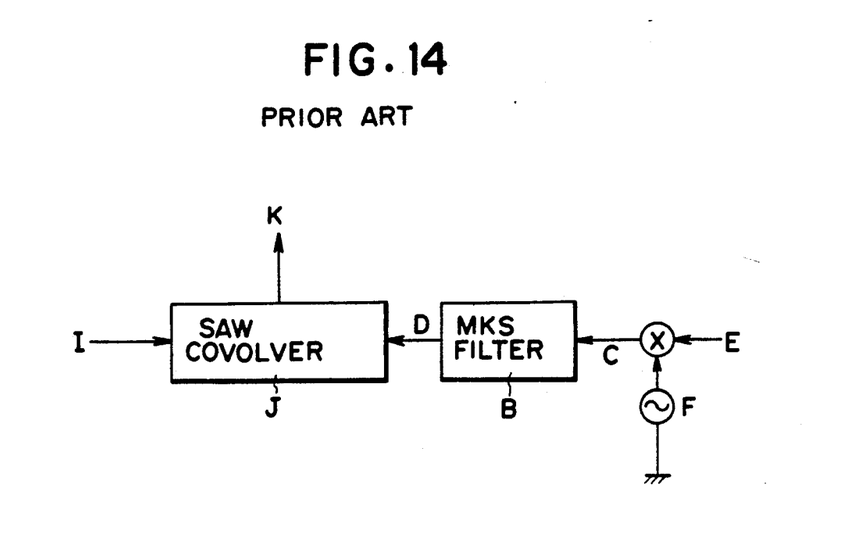
FIG. 14 s a block diagram of a receiver arrangement of an SSC.

However, when using MSK modulation in SSC, the receiver requires a larger space and a higher cost than the use of BPSK as shown in FIG. 14 because MSK is used in combination with a SAW convolver in the receiver side. In FIG. 14, a received signal in SSC labeled with I is in the form of MSK modulation. J refers to a SAW convolver which is an element for effecting a convolution computation between the entered signal I and the reference signal D. The reference signal D is an MSK-modulated wave as shown in FIG. 13.

In BPSK, the entered signal I is a BPSK wave, and the reference signal of FIG. 14 may be BPSK. Therefore, the MSK filter B of FIG. 14 may be omitted. However, MSK necessarily requires the MSK filter B and this increases the space and the cost.

OBJECT OF THE INVENTION

It is therefore an object of the invention to provide a small-scaled, inexpensive MSK SAW convolver.

SUMMARY OF THE INVENTION

In order to attain the object, a SAW device according to a first invention as recited in claim 1 includes a piezoelectric substrate, a first surface-acoustic-wave transducer provided on said piezoelectric substrate, a second surface-acoustic-wave transducer provided on said piezoelectric substrate and having a bandwidth different from that of said first surface-acoustic-wave transducer and an output gate electrode provided between said first and second transducers, and is characterized in that said first transducer, said second transducer and said output gate electrode are arranged in a SAW propagating direction.

A SAW device according to a second invention as recited in claim 4 includes, in addition to the first SAW device, a third surface-acoustic-wave transducer provided on the piezoelectric substrate, and is characterized in that said first, second and third transducers as well as the output gate electrodes are arranged in the SAW propagating direction.

A SAW device according to a third invention as recited in claim 9 includes three surface-acoustic-wave transducers one of which is an MSK transducer located in the center. Between the MSK transducer and another transducer is disposed an output gate electrode for a surface-acoustic-wave convolver. The output gate electrode is in the form of the same metal film as the transducers. Two transducers other than the MSK transducer are wideband transducers, whereas the MSK transducer satisfies relationships:

$$f_1 \simeq f_c - \frac{1}{4T}$$

$$f_2 \simeq f_c + \frac{1}{4T}$$

$$f_c \simeq \frac{2m+1}{4T}$$

The MSK transducer adjacent the output gate electrode is supplied with a BPSK signal whose code has the clock period T and the center frequency $f_1$ and is used as a reference signal of a convolver. The MSK transducer has the time width T and the center frequency $f_2$ which satisfy the above-indicated conditions.

In the first inventive SAW device, one of the transducers, for example, is a wideband transducer while the other is an MSK transducer which satisfies the following relationship.

To the MSK transducer is applied a BPSK signal whose code has the clock period T and the center frequency $f_1$. The time width T and the center frequency $f_2$ of the MSK transducer are as follows:

$$f_1 \simeq f_c - \frac{1}{4T}$$

-continued $$f_2 \simeq f_c + \frac{1}{4T}$$

$$f_c \simeq \frac{2m+1}{4T}$$

A convolution output between the signal applied to the wideband transducer and the signal applied to the MSK transducer is obtained from the output gate electrode.

In the second SAW device, the central transducer, for example, among three transducers is a wideband transducer, and one of the others satisfies the following relationships:

$$f_1 \simeq f_c - \frac{1}{4T}$$

$$f_2 \simeq f_c + \frac{1}{4T}$$

$$f_c \simeq \frac{2m+1}{4T}$$

where
$f_1$: center frequency of the input signal,
$f_2$: center frequency of the transducer,
T: clock period
m: positive integer, and the remainder satisfies the relationships:

$$f_1' \simeq f_c' - \frac{1}{4T'}$$

$$f_2' \simeq f_c' + \frac{1}{4T'}$$

$$f_c' \simeq \frac{2m+1}{4T'}$$

where
$f_1'$: center frequency of the input signal,
$f_2'$: center frequency of the transducer,
T': clock period,
m: positive integer.

The wideband transducer is supplied with an MSK-modulated spread-spectrum signal whereas the MSK transducer adjacent the gate output electrode is supplied with a reference signal, and a correlation output between these signals is extracted from the convolver output gate. The wideband transducer is supplied with a BPSK signal whose code has the clock period T' and the center frequency $f_1'$. The BPSK signal satisfies the relationship $$f_1' \simeq f_c' - \frac{1}{4T'}$$

and the entered BPSK signal is outputted from the MSK transducer not adjacent the convolver output gate electrode, in order to use it in MSK modulation in which the signal is used as a transmission signal.

In a preferred embodiment of the invention, $f_1=f_1'$, $f_2=f_2'$, $T=T'$ and $f_c=f_c'$ are also acceptable.

DETAILED DESCRIPTION

The invention is described below in detail, referring to preferred embodiments illustrated in the drawings. They are not but examples, and the invention involves various modifications and improvements not departing from the scope thereof.

Figure 1:
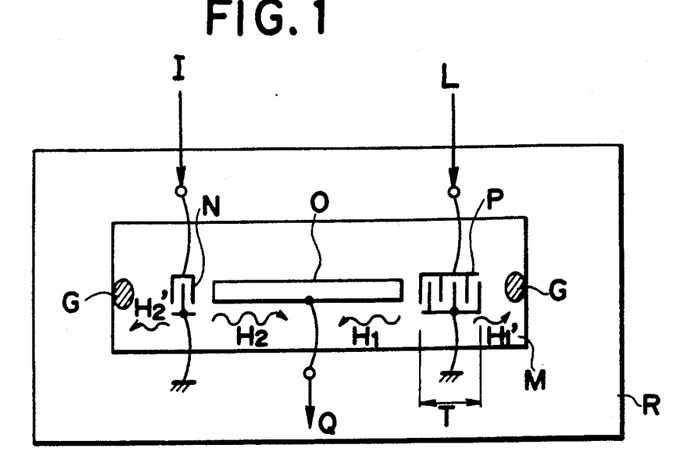
FIG. 1 is a plan view of a first SAW device according to the first invention.

FIG. 1 is a plan view of an embodiment of a first SAW device according to a first invention. In FIG. 1, symbol I refers to a convolver input MSK signal, N to a convolver input transducer, O to a convolver output gate, P to a convolver reference MSK transducer, L to a convolver reference BPSK signal, Q to a convolver output signal, M to a piezoelectric substrate, T to the time width of the transducer P, G to a SAW absorber, R to an MSK convolver, and $H_1$ and $H_2$ to surface acoustic waves travelling to the left and to the right.

The SAW transducers N and P made from aluminum or other metal are provided on the piezoelectric substrate M made from lithium niobate, etc. Between N and P is provided the convolver output gate electrode 0 in the form of a rectangular metal sheet. The SAW absorbers G are provided at opposite ends of the piezoelectric substrate outside the transducers N and P with respect to the gate electrode 0.

This embodiment operates as explained below.

The said arrangement effects the basically same operation as a SAW elastic convolver disclosed in:

(Document 5)

"High performance Elastic Convolver With Parabolic Horns", I. Yao, 1980 Ultrasonics Symposium, pp.37-42 but it is different in the following respects.

In an elastic convolver, in general, the input transducers are equivalent at opposite sides of the gate. In FIG. 1, however, one of the transducers is the wideband transducer N while the other transducer P has the timewidth T. Here, T coincides with the clock period of the code in the SSC. All explanation given here is directed to a direct sequence system in the SSC.

R in FIG. 1 is a SAW convolver for MSK waves, and it is called "MSK convolver" here.

The input signal I to the MSK convolver R is a received signal in the SSC receiver, and it is an MSK-modulated wave. When the signal I is applied to the transducer N, the SAW $H_2$ travelling to the right is generated.

Since the transducer N is the wideband transducer, the SAW $H_2$ is an MSK-modulated SAW. Although there also exists a SAW $H_2'$ travelling to the left from the transducer N, it is absorbed by the absorber G.

The other input signal L to the MSK convolver R is applied to the transducer P. The input signal L is a BPSK signal having the clock period T and the center frequency $f_1'$ and corresponds to C of FIG. 13. When the signal L is entered in the transducer P having the time width T, the MSK-modulated SAW $H_1$ shown by Expression (1) propagates to the left as a result of convolution between the input signal L and the impulse responsive time width T of the transducer P. Similarly, the SAW $H_1'$ travelling to the right is absorbed by the absorber G. It is noted that the transducer P has the center frequency $f_2$ and satisfies Expressions (2), (3) and (4). Therefore, the transducer P is called "MSK transducer".

As described, the SAW's $H_2$ and $H_1$ shown in FIG. 1 are both MSK-modulated SAW's, and a convolution signal is generated on the gate similarly to the operation of a normal SAW convolver, so that the output Q is obtained.

In this way, in the MSK convolver of FIG. 1, one of the transducers performs conversion from BPSK to MSK so that convolution with the signal from the other input transducer is obtained.

That is, the MSK convolver R has both functions of an MSK filter and a SAW convolver.

A large difference of the present invention from Document 4 and from FIG. 13 lies in the following point. In Document 4 and in FIG. 13, an MSK wave is generated by first converting a BPSK wave into a SAW by the transducer $T_1$ and subsequently detecting the SAW in the transducer $T_2$ thereby to obtain an electric output signal D. The output electric signal D is the MSK wave. In contrast, in the present invention, the electric signal BPSK wave L is directly entered in the MSK transducer P thereby to produce the MSK-modulated SAW $H_1$. Therefore, in the present invention, one process is removed in conversions from an electrical amount to a SAW and vice versa as compared to the prior art technique, and the loss is reduced accordingly.

As a result, the MSK filter portion B shown in FIG. 14 can be omitted, and the MSK convolver of FIG. 1 contributes to a dimensional reduction and a cost reduction.

Further, since the input transducers N and P are different in the number of electrode fingers alone and may be normal or standard type transducers, the arrangement is simple.

Although the arrangement of FIG. 1 has been explained as being an elastic structure, it is also acceptable in the medium-separated convolver shown in Document 1 and in a SAW convolver of a multi-layer structure shown in:

(Document 6)

"Efficient ZnO-SiO$_2$-Si Sezawa Wave Convolver", S. Minagawa et al. IEEE Transactions on Sonics and Ultrasonics, Vol. SU-32, No. 5, 1985, pp. 670-674.

The wideband transducer referred to in the aforegoing explanation has the band width different from the MSK transducer and has a wider band characteristic than the MSK transducer. In this meaning, it is called "wideband transducer" here.

Figure 2:
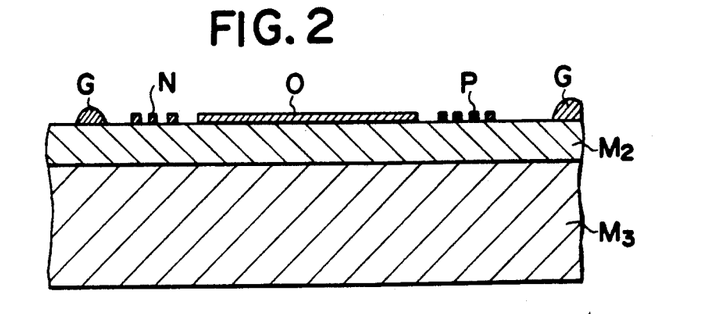
FIG. 2 is a cross-sectional view of the device of FIG. 1 for a multi-layer structure.

FIG. 2 is a cross-sectional view of the device of Figure for a multi-layer structure.

A piezoelectric layer $M_2$ made from zinc oxide, etc. is provided on a semiconductor substrate $M_3$ made from silicon, etc. On the piezoelectric layer $M_2$ are provided transducers N and P and an output gate electrode 0 in the form of aluminum or other metal films.

In case of a multi-layer structure, a semiconductor substrate $M_3$ of (100) silicon surface with [100] and [110] SAW propagating directions or of (110) silicon surface with [100] SAW propagating direction in combination with a piezoelectric film $M_2$ made from zinc oxide is particularly used. In this structure, the electromechanical coupling coefficient is large, and it is remarkable when Sezawa wave is used. Therefore, a very effective SAW device is obtained. Further, an insulating layer made from silicon dioxide, etc. may be provided between silicon $M_3$ and zinc oxide $M_2$.

The aforegoing explanation has been given as strictly satisfying Expressions (2) through (4). However, these relationships need not be strict but may be established approximately.

Figure 3:
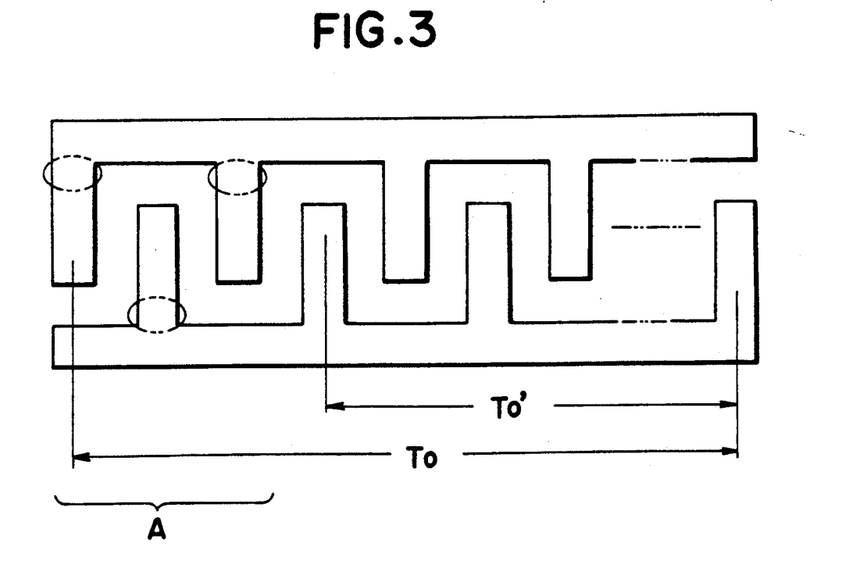
FIGS. 3, 4 and 5 are plan views of comb-shaped electrodes corresponding to changes in the clock period.

The MSK electrode in FIG. 1 and FIG. 2 has the same time width as the clock period T of the code used therein. Therefore, it cannot accommodate the other clock periods. In order to overcome the problem, the MSK electrode may be partly removed at dotted line portions as shown in FIG. 3 by laser trimming, etc. after deposition of the MSK electrode so as to change the original MSK electrode width from $T_0$ to $T_0'$. The removed region A is preferably an MSK electrode portion at the end of the element in FIG. 1, i.e. at the end near the absorber G.

The region A remaining after the removal in FIG. 3 is a disused portion, and a SAW is sometimes reflected by the portion. In order to suppress it, the arrangement of FIG. 4 may be used.

Figure 4:
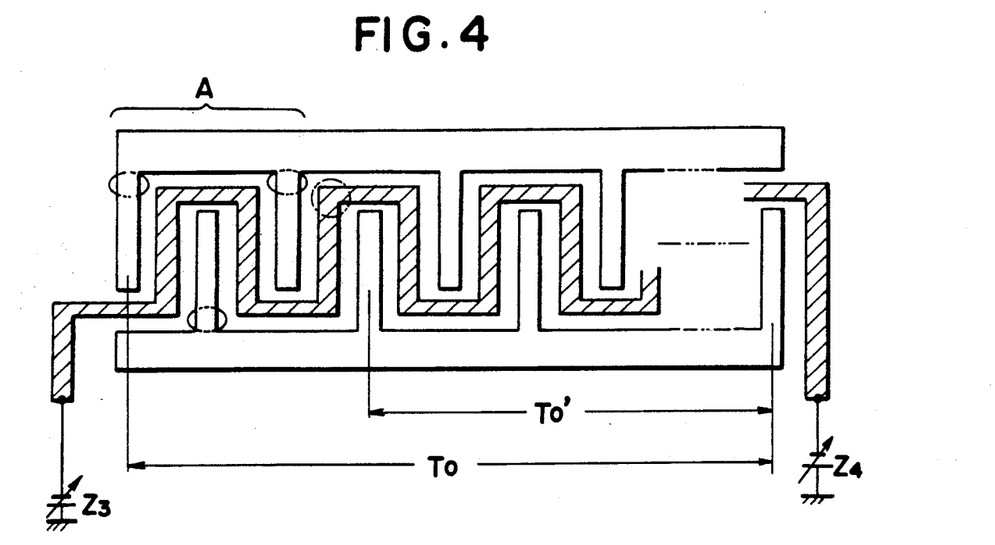

It should be noted here that the pattern of FIG. 4 is provided on the multi-layer structure of FIG. 2. The purpose of using the multi-layer structure is to use the following characteristics. The structure of FIGS. 2 and 4 is basically a MIS (metal-insulator-semiconductor) structure. When a bias voltage is applied to a metal portion of the MIS structure from a d.c. source, the silicon surface condition is changed, depending on the magnitude and the polarity. That is, it is changed to a charged, depletion or inverted condition. The SAW propagating loss is largely changed by the silicon surface condition. Regarding this phenomenum, refer to Document 6 above and (Document 7)

"A Detailed Theory of the Monolithic Zinc Oxide on Silicon Convolver", B. T. Khuri-Yakub, G.S. Kino, IEEE Transactions on Sonics and Ultrasonics, Vol. SU-24, No. 1, 1977, pp. 34–43.

FIG. 4 shows a transducer which has the same pitch as the MSK transducer of FIG. 3. However, it includes a meander line shown by hatching between upper and lower comb-shaped portions. Similarly to FIG. 3, the dotted line portions and the meander line portion are cut off.

A bias is applied from a d.c. source $Z_3$ to the meander line in the unnecessary region A to increase the SAW propagating loss, and a bias is applied from a d.c. source $Z_4$ to the effective region (right-hand portion of FIG. 4) to decrease the SAW propagating loss.

In this way, the SAW is attenuated greatly in the unnecessary region A, and the SAW reflection is suppressed. Further, a bias voltage may also be applied to the comb-shaped portion.

Figure 5:
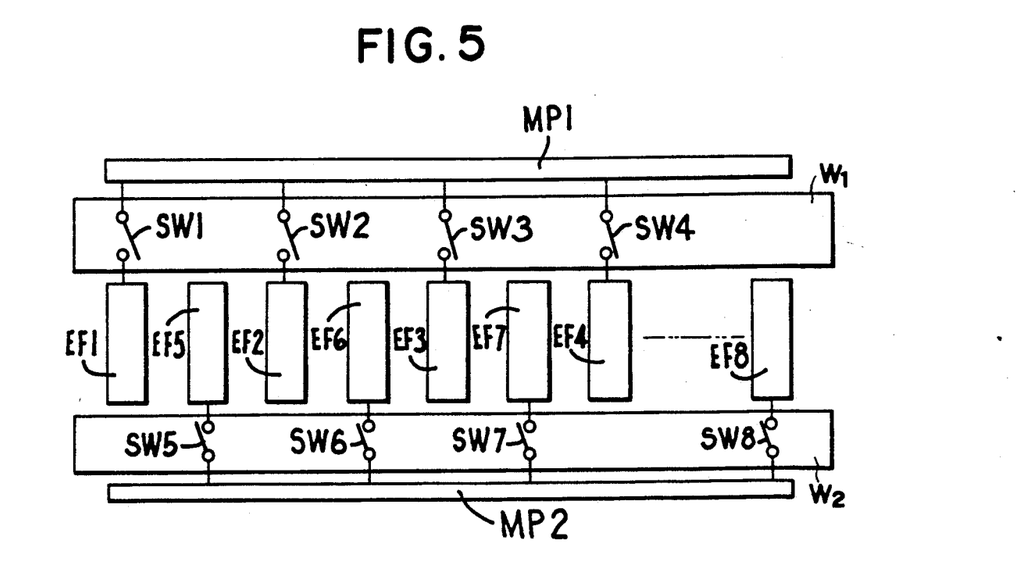

In FIGS. 3 and 4, the MSK electrode width is changed by cutting off the electrode by laser trimming, etc. However, if the cut-off portions are replaced by semiconductor switches and selectively switched, a flexible, variable device is obtained. FIG. 5 corresponds to FIG. 3, and $W_1$ and $W_2$, are semiconductor switch arrays.

More specifically, the switch array $W_1$ includes a plurality of selectively actuable semiconductor switches SW1-SW4 which can each connect a main portion MP1 of one electrode to a respective electrode finger EF1-EF4, and the switch array W2 includes a plurality of selectively actuable semiconductor switches SW5-SW8 which can each connect a main portion MP2 of a second electrode to a respective electrode finger EF5-EF8. The fingers EF1-EF4 of the first electrode are interdigitated with the fingers EF5-EF8 of the second electrode. To simulate the laser cut-off portions in FIG. 3, respective switches SW1-SW8 in FIG. 5 are turned off, and the other finger portions each operational due to a switch-on condition. Further, it is evident that FIG. 4 can also be provided with similar semiconductor switch arrays.

In this embodiment, since the time width of the MSK electrode can be changed, it is possible to change the clock period of the code used therein. Therefore, a flexible MSK convolver is established.

Figure 6:
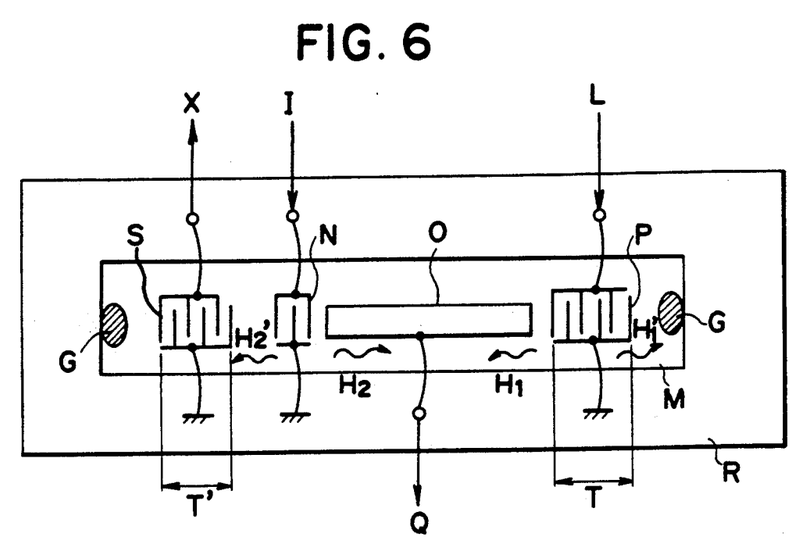
FIGS. 6 and 7 are plan views of a second SAW device according to the second invention.

FIG. 6 is a plan view of an embodiment of a second SAW device according to the second invention. In FIG. 6, the same reference numerals or symbols as those of FIG. 1 denote identical or equivalent portions. S refers to an MSK transducer similar to the transducer P, and X indicates an output signal from the transducer S.

Its operation in case of the absence of the transducer S is identical to the device of FIG. 1.

Its operation in case of the presence of the transducer S is explained below.

The transducer S is similar in configuration to the MSK transducer P described heretofore, but it is an MSK transducer having the time width T' and the center frequency $f_2'$. The transducer S, as shown in FIG. 6, is made from aluminum or other metal on the piezoelectric substrate M similarly to the transducers N and P and output gate O. Further, the transducer S is located in the opposite portion to the output gate O with respect to the transducer N.

The MSK transducer S is used as explained below.

In FIG. 6, since the transducer N is a wideband transducer whereas the transducer S is an MSK transducer, they formally form the MSK filter of FIG. 13.

Therefore, an input signal I to the transducer N in FIG. 6 corresponds to the BPSK signal shown at C in FIG. 13, and an output signal X from the transducer S corresponds to the MSK output D of FIG. 13.

Therefore, it is possible to operate a pair of the transducers N and S as an MSK filter which produces an MSK wave. However, the MSK wave S(t) at this time has the following relationships derived from Expressions (1) through (4):

$$S(t) = a_I(t)\cos\left(\frac{\pi t}{2T'}\right)\cos 2\pi f_c't + a_Q(t)\sin\left(\frac{\pi t}{2T'}\right)\sin 2\pi f_c't \quad (5)$$

$$f_2' = f_c' + \frac{1}{4T'} \quad (6)$$

$$f_1' = f_c' - \frac{1}{4T'} \quad (7)$$

-continued $$f_c' = \frac{2m' + 1}{4T'} \quad (8)$$

where T' is the clock period of the baseband code, and equals the time width of the MSK transducer.

Therefore, the construction of FIG. 6 operates as an MSK convolver as explained about the former embodiment, and taking into consideration the transducer S explained before, it operates as an MSK filter capable of generating an MSK wave.

The use of the functions enables the following operation.

Figure 7:
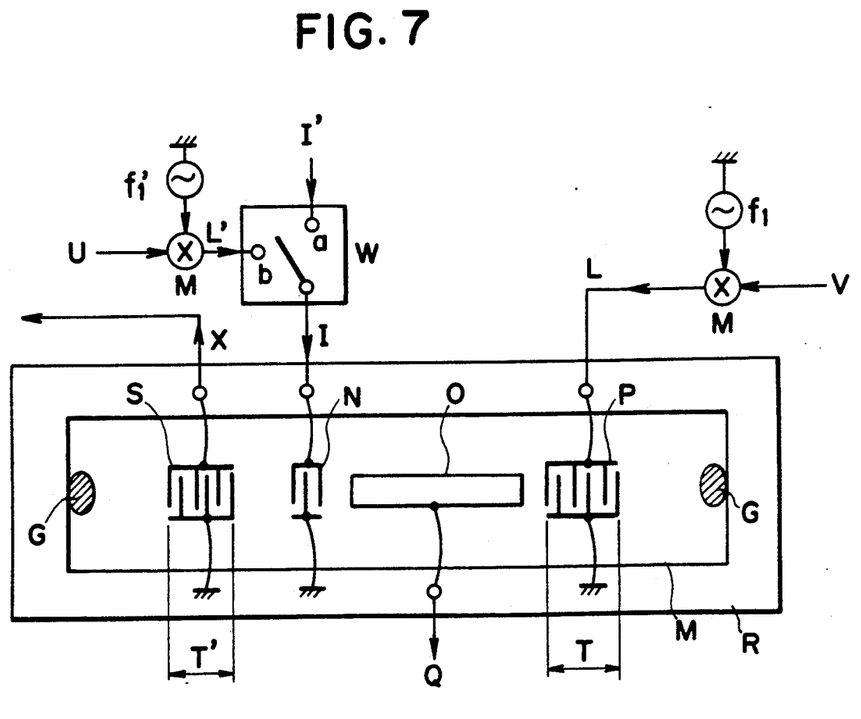

In FIG. 7, an MSK convolver R is identical to FIG. 6, I' refers to an SSC received signal, and V denotes a code to be correlated with the received signal I'. W designates a switch, and when it is at a position a, it permits a received signal to enter in the transducer N and permits a reference BPSK wave L to enter in the transducer P. As a result, a convolution signal Q is obtained from the output gate O. That is, it operates as an MSK convolver. When the switch W is at a position b, a BPSK wave L' using a transmission code is entered in the transducer N, and an MSK wave X shown by Expressions (5) through (8) is obtained from the transducer S. The MSK signal X is transmitted subsequently.

That is, the device can function not only as a receiver using the MSK convolver but also as a MSK-modulated transmitter. When the received MSK wave and the transmitter MSK wave are identical (the kind of code may be different), U, M, V, $f_1$ and $f_1'$ in the drawing are identical. This means that a single system suffices the device. The aforegoing explanation has been given as strictly satisfying Expressions (2) through (4) and (5) through (8). However, these relationships need not be strict but may be established approximately.

The structure of FIG. 6 has been explained as being an elastic structure. However, this embodiment is also effective in the medium-separated convolver shown in Document 1 and in the multi-layer SAW convolver shown in Document 6.

In FIG. 6, signals required upon an operation as a convolver, for example, are SAW's $H_1$ and $H_2$. In the aforegoing explanation, the SAW $H_2'$ travelling to the left from the transducer N was explained as being absorbed by the absorber G. However, since the transducer S exists between the transducer N and the absorber G, the SAW $H_2'$ travelling to the left is partly reflected by the transducer S and propagates back to the right. Since this SAW component also travels toward the output gate O as the SAW $H_2$ does, it is an undesired wave. Similarly, in MSK modulation, necessary transducers are N and S. When a BPSK signal I is entered in the transducer N, the effective SAW is $H_2$ propagating to the left. A SAW $H_2$ travelling from the transducer N to the right also exists, and it is reflected by the transducer P and travels back to the left. Since the component propagates to the transducer S, it is also an undesired wave.

Means for suppressing such an undesired wave is explained below. The multi-layer structure shown by Document 6 is effective as this means, and its theory is explained, referring to FIGS. 8 and 9.

Figure 8:
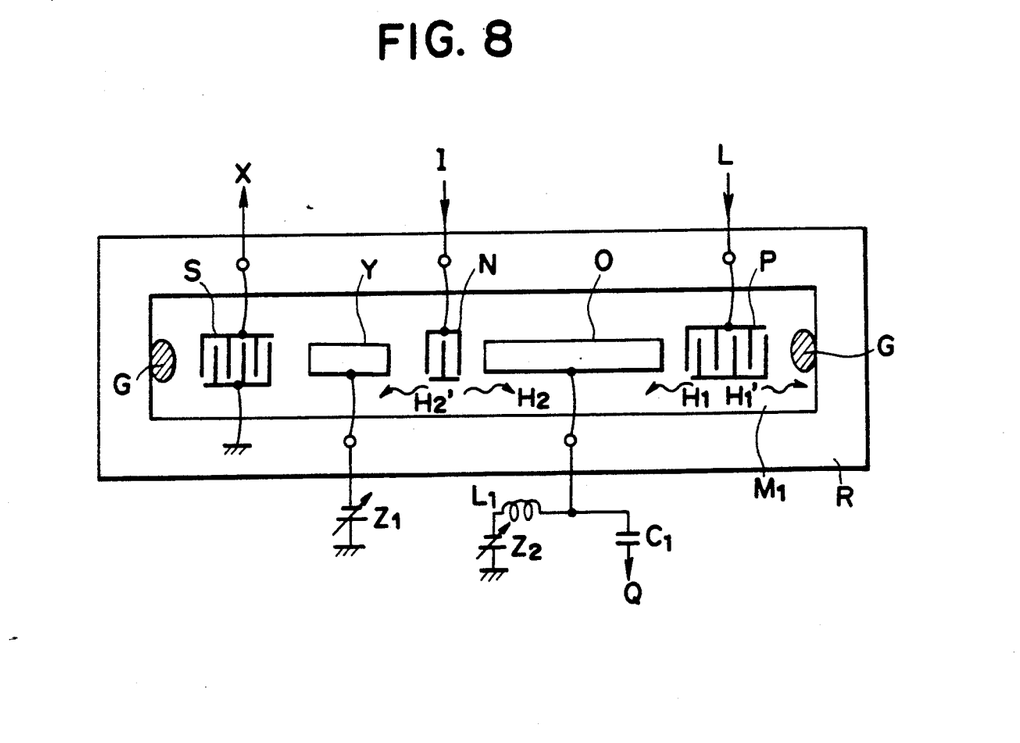
FIG. 8 is a plan view for explaining the theory of a multi-layer SAW device.
Figure 9:
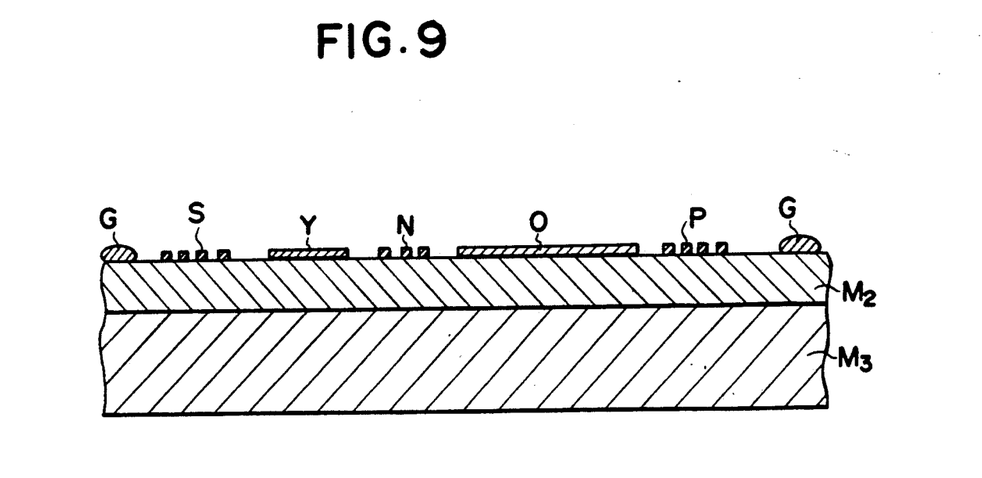
FIG. 9 is a cross-sectional view of the device of FIG. 8.

FIG. 8 is a plan view and FIG. 9 is a cross-sectional view. As shown in FIG. 9, a piezoelectric layer $M_2$ made from zinc oxide or other material is provided on a semiconductor substrate $M_3$ made from silicon, etc. Similarly to FIG. 6, transducers S, N and P, output gate O and control electrode Y all made from metal are provided on the piezoelectric layer $M_2$. The device of FIG. 8 is different from FIG. 6 in the use of the rectangular control electrode Y between the transducers S and N.

As shown in FIG. 9, the arrangement just below the electrodes O and Y forms a MIS (metal-insulator-semiconductor) structure.

The control electrode Y is connected to an external d.c. source $Z_1$. The output gate O is connected to a d.c. source $Z_2$ via an a.c. cutting inductance $L_1$, and a convolution output Q is obtained through a d.c. cutting capacitor $C_1$.

When a bias is applied to the control electrode Y from the d.c. source $Z_1$, the surface condition of the silicon $M_3$ is changed to a charged, depletion or inverted condition, depending on the bias voltage. The SAW propagation loss largely varies with the silicon surface condition (regarding this phenomenum, see Document 6 and Document 7).

In order to activate the device of FIG. 8 as a convolver, for example, since the SAW $H_2'$ propagating to the left from the transducer N is not used yet, the propagation loss of the SAW $H_2'$ is increased by applying a bias from the source $Z_1$ to the control electrode Y. Therefore, the component of the SAW $H_2'$ arriving at the transducer S is very small, and the component reflected back to the right by the transducer S is very small, accordingly. As a result, the problem regarding the aforementioned undesired wave is greatly decreased. This also applies to MSK modulation, i.e., undesired waves can be greatly suppressed by applying a bias from the source $Z_2$ to the output electrode 0 and increasing the propagation loss in the convolver region.

In FIG. 9, control of the surface condition of the silicon $M_3$ is effected via the electrode provided on the piezoelectric layer $M_2$. However, means for changing the surface condition is not limited to this.

Figure 10:
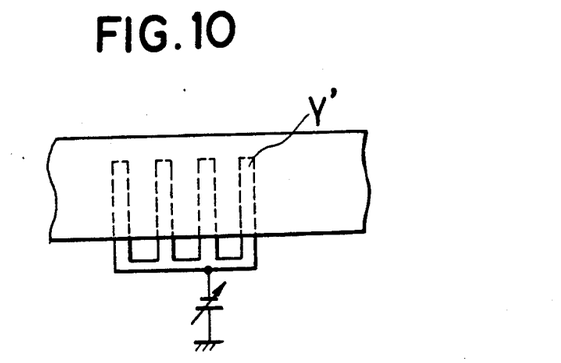
FIGS. 10 and 11 are fragmentary plan and cross-sectional views of a SAW device according to a further embodiment.
Figure 11:
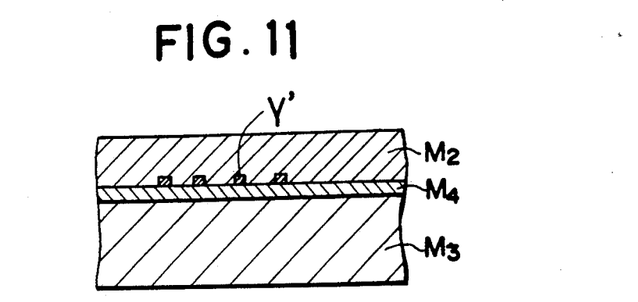

For example, as shown in FIGS. 10 and 11, an insulating layer $M_4$ made from silicon dioxide, etc. is provided on the silicon substrate $M_3$, and a metal layer Y' in the form of strips is provided on the insulating layer $M_4$. Further, the piezoelectric layer $M_2$ is provided on them. Since Y', $M_4$ and $M_3$ also form a MIS structure, a similar effect is obtained.

The transducer arrangement of FIG. 7 includes one wideband transducer and two MSK transducers. Although the type of the transmission code and the type of the received MSK wave code mentioned in the explanation of FIG. 7 are different, a single MSK transducer is acceptable if the other conditions are unchanged.

Figure 12:
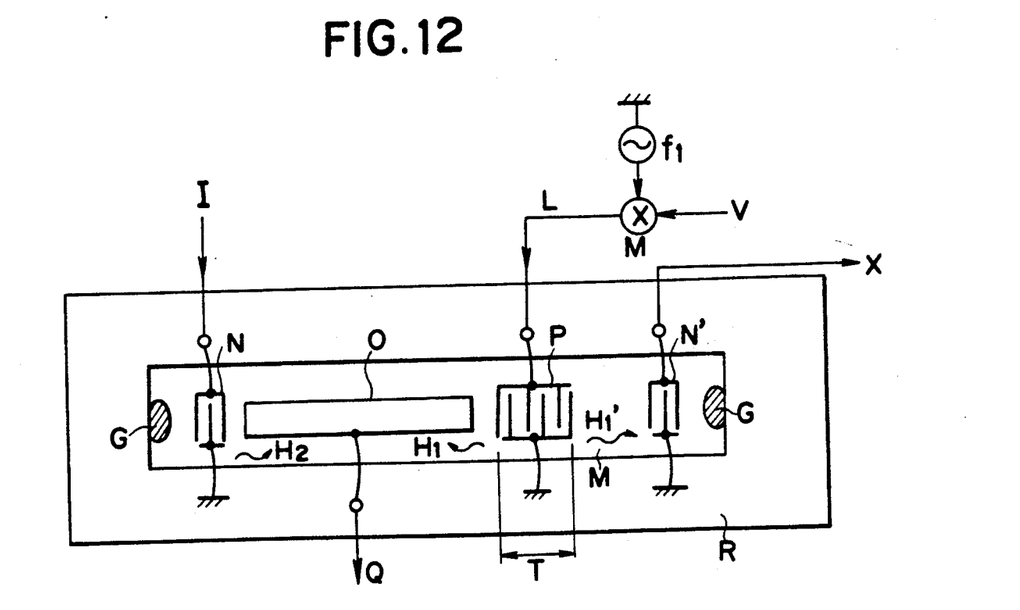
FIG. 12 is a schematic view for explaining the operation of a third SAW device according to the third invention.

In this case, an embodiment of a SAW device according to the third invention as recited in claim 3 and shown in FIG. 12 is effective. More specifically, as shown in FIG. 12, the same or similar effect is obtained in an arrangement including two wideband transducers N and N' and an MSK transducer P and wherein the wideband transducer N, convolver output gate O, MSK transducer P and wideband transducer N' are arranged in sequence along the SAW propagating direction. It is noted that the MSK transducer P must satisfy Expressions (2), (3) and (4).

In FIG. 12, I refers to a received signal, and V refers to a code having the clock period T to be correlated with the received signal I. The code V is applied to the MSK transducer P as a BPSK signal. Responsively, a correlation output between the SAW's $H_1$ and $H_2$ is generated at the convolver output gate O, and Q is obtained as an output.

When using the device for transmission, V is a code to be transmitted. It is converted into the SAW $H_1'$ by the MSK transducer P, and an MSK wave X is obtained from the wideband transducer N' and transmitted to a receiver.

In the aforegoing explanation, filters, amplifiers, antennas, etc. are omitted in transmitter's and receiver's arrangements.

As described above, according to the invention, a small-scaled, less-expensive MSK SAW convolver is obtained.

What is claimed is:

1. A surface-acoustic-wave device comprising:
   a piezoelectric substrate;
   a wide-band first surface-acoustic-wave input transducer provided on said piezoelectric substrate;
   a second surface-acoustic-wave input transducer provided on said piezoelectric substrate and having a bandwidth different from that of said first surface-acoustic-wave input transducer, said second input transducer being an MSK transducer having a predetermined width in a surface acoustic wave propagating direction;
   an output gate electrode provided on said piezoelectric substrate between said first and second input transducers, said first and second input transducers and said output gate electrode being disposed along said surface-acoustic-wave propagating direction; and
   means for supplying to said second input transducer a signal including a code having a clock period T and a center frequency $f_1$, said width of said MSK transducer being substantially equal to said clock period T and said MSK transducer having a center frequency $f_2$ satisfying:

$$f_1 \approx f_c - \frac{1}{4T}$$

$$f_2 \approx f_c + \frac{1}{4T}$$

$$f_c \approx \frac{2m+1}{4T}$$

where m is a positive integer and $f_c$ is a center frequency.

2. The surface-acoustic-wave device according to claim 1, wherein said piezoelectric substrate includes a semiconductor substrate and a piezoelectric layer provided on said semiconductor substrate.

3. A surface-acoustic-wave device comprising:
   a piezoelectric substrate;
   a first surface-acoustic-wave transducer provided on said piezoelectric substrate;
   a second surface-acoustic-wave transducer provided on said piezoelectric substrate and having a bandwidth different from that of said first surface-acoustic-wave transducer;
   an output gate electrode provided on said piezoelectric substrate between said first and second transducers; and
   a third surface-acoustic-wave transducer provided on said piezoelectric substrate, said first, second and third transducers and said output gate electrode being disposed along a surface acoustic wave propagating direction; wherein said first transducer is located between said second and third transducers and is a wideband transducer, wherein said second transducer is an MSK transducer, including means for supplying to said second transducer a BPSK signal having a code clock period T and a center frequency $f_1$ and wherein said second transducer has in said surface-acoustic-wave propagating direction a width substantially equal to said clock period T and has a center frequency $f_2$ satisfying:

$$f_1 \approx f_c - \frac{1}{4T}$$

$$f_2 \approx f_c + \frac{1}{4T}$$

$$f_c \approx \frac{2m+1}{4T}$$

where m is a positive integer and $f_c$ is a center frequency, and wherein said third transducer is an MSK transducer which has in said surface-acoustic-wave propagating direction a width substantially equal to a clock period T' and has a center frequency $f_2'$ satisfying:

$$f_2' \approx f_c' + \frac{1}{4T'}$$

$$f_c' \approx \frac{2m'+1}{4T'}$$

where m' is a positive integer and $f_c'$ is a center frequency.

4. The surface-acoustic-wave device according to claim 3, including means for supplying to said wideband transducer an MSK-modulated spread-spectrum signal, and wherein said BPSK signal supplied to said second transducer is a reference signal, whereby a correlation output between said spread-spectrum and reference signals is produced at said convolver output gate.

5. The surface-acoustic-wave device according to claim 4, satisfying:

$$f_1 = f_1'$$
$$f_2 = f_2'$$
$$T = T'$$
$$f_c = f_c'$$

6. The surface-acoustic-wave device according to claim 3, wherein said device is a multi-layer structure in which said piezoelectric substrate includes a semiconductor substrate and a piezoelectric layer provided on said semiconductor substrate, said transducers and said output gate electrode being metal layers provided on said piezoelectric layer.

7. The surface-acoustic-wave device according to claim 3, satisfying:

$$f_1 = f_1'$$
$$f_2 = f_2'$$
$$T = T'$$
$$f_c = f_c'$$

8. A surface-acoustic-wave device comprising:
   a piezoelectric substrate;
   a first surface-acoustic-wave transducer provided on said piezoelectric substrate;
   a second surface-acoustic-wave transducer provided on said piezoelectric substrate and having a bandwidth different from that of said first surface-acoustic-wave transducer;

an output gate electrode provided on said piezoelectric substrate between said first and second transducers;

a third surface-acoustic-wave transducer provided on said piezoelectric substrate, said first, second and third transducers and said output gate electrode being disposed along a surface acoustic wave propagating direction; and means for supplying to said wideband transducer a BPSK signal including a code having a clock period T' and a center frequency $f_1'$, said BPSK signal satisfying:

$$f_1' \simeq f_c' + \frac{1}{4T'}$$

where $f_c'$ is a center frequency, and said BPSK signal being outputted from said third transducer as an MSK signal.

9. A surface-acoustic-wave device comprising: three surface-acoustic-wave transducers, a first of said transducers being an MSK transducer located between a second and a third of said transducers; a surface-acoustic-wave convolver output gate electrode disposed between said first transducer and said second transducer and being made from a metal layer, said second and third transducers being wideband transducers, said first transducer satisfying:

$$f_1 \simeq f_c - \frac{1}{4T}$$

$$f_2 \simeq f_c + \frac{1}{4T}$$

$$f_c \simeq \frac{2m+1}{4T}$$

where m is a positive integer and $f_c$ is a center frequency, and including means for supplying to said first transducer a BPSK signal, said BPSK signal including a code having a clock period T and a center frequency $f_1$ and being a reference signal, said first transducer having in said surface-acoustic-wave propagating direction a width substantially equal to said clock period T and having a center frequency $f_2$.

10. The surface-acoustic-wave device according to claim 9, wherein said device is a multi-layer structure including a semiconductor substrate and a piezoelectric layer provided on said semiconductor substrate, said transducers and said output gate electrode being metal layers provided on said piezoelectric layer.

* * * * *

UNITED STATES PATENT AND TRADEMARK OFFICE
CERTIFICATE OF CORRECTION

PATENT NO. : 5 033 063
DATED : July 16, 1991
INVENTOR(S) : Takeshi OKAMOTO et al It is certified that error appears in the above-identified patent and that said Letters Patent is hereby corrected as shown below:

Column 12, line 26; replace "$f_2' \simeq f_c' + \frac{1}{4T}$" with ---$f_2' \simeq f_c' + \frac{1}{4T'}$---.

Column 12, line 28; replace "$f_c' \simeq \frac{2m'+1}{4T}$" with ---$f_c' \simeq \frac{2m'+1}{4T'}$---.

Column 12, line 45; replace "T = T" with ---T = T'---.
Column 12, line 61; replace "T = T" with ---T = T'---.

Column 13, line 16; replace "$f_1' \simeq f_c' + \frac{1}{4T}$" with ---$f_1' \simeq f_c' + \frac{1}{4T'}$---.

Signed and Sealed this

Ninth Day of March, 1993

Attest:

STEPHEN G. KUNIN

Attesting Officer     Acting Commissioner of Patents and Trademarks